United States Patent [19]
Ishii et al.

[11] Patent Number: 6,115,234
[45] Date of Patent: Sep. 5, 2000

[54] MULTILAYER MICROELECTRONIC CIRCUIT WITH TRIMMABLE CAPACITORS

[75] Inventors: Tetsuya Ishii; Hiroshi Katagiri, both of Aichi; Tadashi Shingaki, Mie; Tatsuya Takemura, Gifu, all of Japan

[73] Assignee: NGK Spark Plug Co., Ltd., Nagoya, Japan

[21] Appl. No.: 09/031,075

[22] Filed: Feb. 26, 1998

[30] Foreign Application Priority Data

Feb. 26, 1997 [JP] Japan .................................. 9-042343

[51] Int. Cl.[7] .......................... H01G 4/005; H01G 4/228
[52] U.S. Cl. ...................... 361/303; 361/306.3; 361/312; 361/321.2; 333/184; 333/185
[58] Field of Search .............................. 361/301.4, 303, 361/306.1, 306.3, 309, 311–313, 320, 321.1–321.5; 333/182–185

[56] References Cited

U.S. PATENT DOCUMENTS

| | | | |
|---|---|---|---|
| 4,470,096 | 9/1984 | Guertin | 361/277 |
| 5,347,423 | 9/1994 | deNeuf | 361/313 |
| 5,523,729 | 6/1996 | Nakai et al. | 333/177 |
| 5,604,658 | 2/1997 | Pedder | 361/277 |

*Primary Examiner*—Dean A. Reichard
*Assistant Examiner*—Anthony Dinkins
*Attorney, Agent, or Firm*—Foley & Lardner

[57] ABSTRACT

The multilayer microelectronic circuit comprises a main capacitor dielectric layer, a main capacitor first electrode disposed on one of opposite sides of the main capacitor dielectric layer, a main capacitor second electrode disposed on the other of the opposite sides of the main capacitor dielectric layer in a way as to oppose the main capacitor first electrode through the main capacitor dielectric layer, a first trimming capacitor dielectric layer disposed on a side of the main capacitor first electrode opposite to the main capacitor dielectric layer, a first trimming capacitor electrode disposed on a side of the first trimming capacitor dielectric layer opposite to the main capacitor first electrode in a way as to oppose the main capacitor first electrode through the first trimming capacitor dielectric layer, a second trimming capacitor dielectric layer disposed on a side of the first trimming capacitor electrode opposite to the first trimming capacitor dielectric layer, and a second trimming capacitor electrode disposed on a side of the second trimming capacitor dielectric layer opposite to the first trimming capacitor electrode in a way as to oppose the first trimming capacitor electrode through the second trimming capacitor dielectric layer. The first trimming capacitor electrode is first trimmed for rough adjustment of a capacitance of the circuit. The second trimming capacitor electrode is then trimmed for fine adjustment of the capacitance.

10 Claims, 4 Drawing Sheets

MULTILAYER MICROELECTRONIC CIRCUIT WITH TRIMMABLE CAPACITORS

BACKGROUND OF THE INVENTION

1. Field of the Invention

The present invention relates to a multilayer microelectronic circuit with a trimmable capacitor, which is adjustable in capacitance over a wide range.

2. Description of the Prior Art

A technique for adjusting the capacitance of a capacitor in a multilayer microelectronic circuit is disclosed in JP 3-71710. In this Japanese patent publication, a multilayer microelectronic circuit is disclosed as a resonator including a pair of electrodes with a dielectric layer being interposed therebetween. On one side of the pair of electrodes is disposed a surface dielectric layer on which a trimmable electrode is mounted. Fine adjustment of the resonance frequency of the resonator, which resonance frequency may deviate from a target value due to manufacturing error, etc., is attained by trimming the trimmable electrode.

The prior art technique, however, is only for fine adjustment of the resonance frequency which may deviate from a target value due to manufacturing error, etc. and does not enable variations or modifications of the resonance frequency of the resonator once manufactured. Thus, for different resonance frequencies, resonators different in capacitance are necessitated. With the prior art technique, it is therefore necessitated to design and manufacture resonators for every frequencies, resulting in a high cost of the resonator.

Further, the prior art technique is only for adjustment of a resonance frequency and cannot regulate the other control factors than the resonance frequency, such as the capacitance for determining a band width of an input/output filter. In other words, the adjustable range of the capacitance of the capacitor in the prior art multilayer microelectronic circuit is small.

SUMMARY OF THE INVENTION

According to an aspect of the present invention, there is provided a novel and improved multilayer microelectronic circuit which is adjustable in capacitance, comprising a main capacitor dielectric layer, a main capacitor first electrode disposed on one of opposite sides of the main capacitor dielectric layer, a main capacitor second electrode disposed on the other of the opposite sides of the main capacitor dielectric layer in a way as to oppose the main capacitor first electrode through the main capacitor dielectric layer, a first trimming capacitor dielectric layer disposed on a side of the main capacitor first electrode opposite to the main capacitor dielectric layer, a first trimming capacitor electrode disposed on a side of the first trimming capacitor dielectric layer opposite to the main capacitor first electrode in a way as to oppose the main capacitor first electrode through the first trimming capacitor dielectric layer, a second trimming capacitor dielectric layer disposed on a side of the first trimming capacitor electrode opposite to the first trimming capacitor dielectric layer, and a second trimming capacitor electrode disposed on a side of the second trimming capacitor dielectric layer opposite to the first trimming capacitor electrode in a way as to oppose the first trimming capacitor electrode through the second trimming capacitor dielectric layer.

In a multilayer microelectronic circuit, the first trimming capacitor electrode and the second trimming capacitor electrode are provided so as to constitute two independent layers such that adjustment of the capacitance can be made by making adjustment to at least two layers. In case a single capacitance is adjusted by using two trimmable electrodes, the capacitance can be adjusted over a wider range and with improved accuracy. The two trimmable electrodes can be used for adjusting the capacitance of two capacitors. Accordingly, the present invention makes it possible for a multilayer microelectronic circuit to be adjustable in the capacitance over a wider range and have a wide range of application, thus resulting in the capability of reducing the cost.

According to another aspect of the present invention, one of the first trimming capacitor electrode and the second trimming capacitor electrode is larger in size and used for rough adjustment of a capacitance of the circuit and the other is smaller in size and used for fine adjustment of the capacitance.

The trimming capacitor electrode of the larger size is for rough adjustment and enables to attain a larger variation or modification of the capacitance. On the other hand, the trimming capacitor electrode of the smaller size is for fine adjustment and enables to attain, by trimming thereof, fine adjustment of the capacitance to a target value.

By trimming the first and second trimming capacitor electrodes, the capacitance of the capacitor in the multilayer microelectronic circuit can be adjusted over a wider range and with improved accuracy, and it can be dispensed with the necessity of designing and manufacturing a new resonator every time when the capacitance is to be changed, thus making it possible to lower the cost of the multilayer microelectronic circuit.

According to a further aspect of the present invention, the first trimming capacitor electrode and the second trimming capacitor electrode constitute part of capacitors for setting a resonance frequency of a resonator.

Application of the present invention to a resonator which has a capacitor for setting a resonance frequency can dispense with the necessity of designing and manufacturing a new multilayer microelectronic circuit every time when the resonance is to be changed, thus making it possible to lower the cost of the multilayer microelectronic circuit.

According to a further aspect of the present invention, the first trimming capacitor electrode and the second trimming capacitor electrode constitute part of capacitors for setting a band width of an input/output filter.

Application of the present invention to capacitors for setting a band width of a input/output filter frequency can dispense with the necessity of designing and manufacturing a new multilayer microelectronic circuit every time when the resonance frequency is to be changed, thus making it possible to lower the cost of the multilayer microelectronic circuit.

According to a further aspect of the present invention, there is provided a novel and improved method of adjusting a capacitance of a multilayer microelectronic circuit which is adjustable in capacitance, comprising the steps of preparing a multilayer microelectronic circuit including a main dielectric layer, a main capacitor first electrode disposed on one of opposite sides of the main dielectric layer, a main capacitor second electrode disposed on the other of the opposite sides of the main dielectric layer in a way as to oppose the main capacitor first electrode through the main capacitor dielectric layer, a first trimming capacitor dielectric layer disposed on a side of the main capacitor first electrode opposite to the main dielectric layer, a first trimming capacitor electrode disposed on a side of the first trimming capacitor dielectric layer opposite to the main capacitor first electrode in a way as to oppose the main capacitor first electrode through the first trimming capacitor dielectric layer, a second trimming capacitor dielectric layer disposed on a side of the first trimming capacitor electrode opposite to the first trimming capacitor electrode, and a second trimming capacitor electrode disposed on a side of the second trimming capacitor dielectric layer opposite to the first trimming capacitor electrode in a way as to oppose the first trimming capacitor electrode through the second trimming capacitor dielectric layer, trimming one of the first trimming capacitor electrode and the second trimming capacitor electrode for rough adjustment of a capacitance of the circuit, and trimming the other of the first trimming capacitor electrode and the second trimming capacitor electrode for fine adjustment of the capacitance.

The above structure and method are effective for overcoming the above noted problems inherent in the prior art device.

It is accordingly an object of the present invention to provide a novel and improved multilayer microelectronic circuit with trimmable or adjustable capacitors which enables adjustment of the capacitance of the circuit over a wider range and with improved accuracy.

It is a further object of the present invention to provide a novel and improved multilayer microelectronic circuit of the foregoing character which enables large variations or modifications of resonance frequency when required, i.e., which has an excellent flexibility in use or application.

It is a further object of the present invention to provide a novel and improved multilayer microelectronic circuit of the foregoing character which enables variations or modifications of a band width of an input/output filter of the circuit in addition to variations or modifications of the resonance frequency.

It is a further object of the present invention to provide a method of producing a multilayer microelectronic circuit of the foregoing character.

DETAILED DESCRIPTION OF THE PREFERRED EMBODIMENTS

Figure 1:
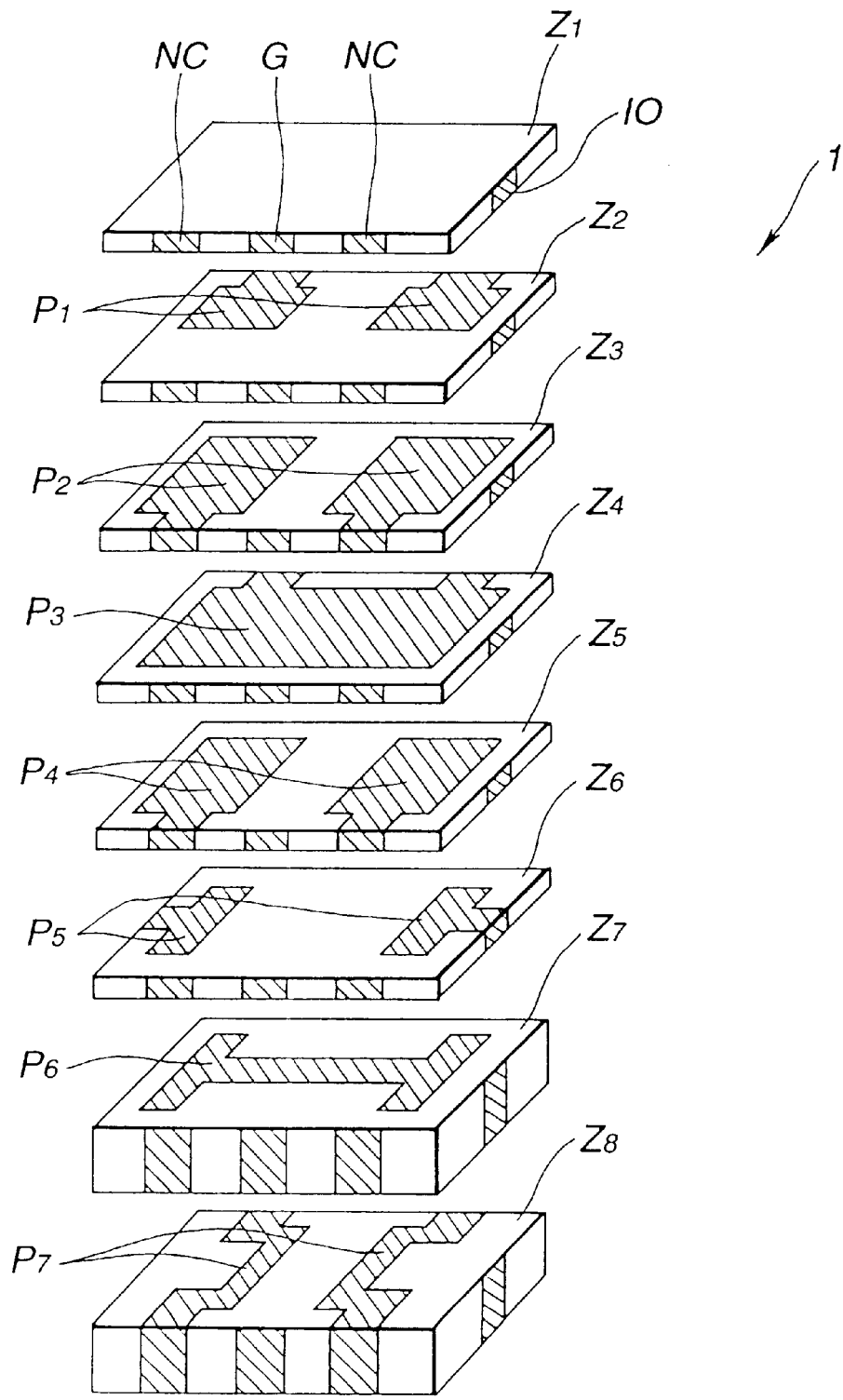
FIG. 1 is an exploded perspective view of a resonator according to an embodiment of the present invention.
Figure 2:
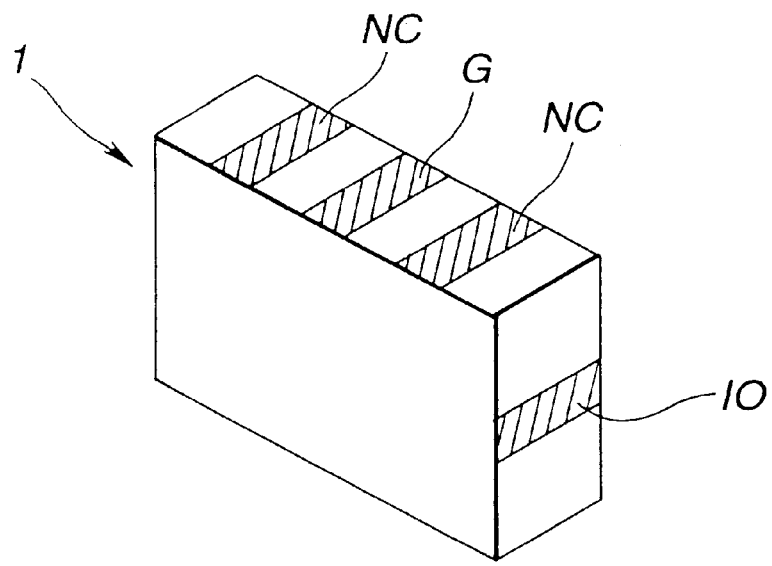
FIG. 2 is a perspective view of the resonator of FIG. 1 as viewed from the upper side thereof.
Figure 3:
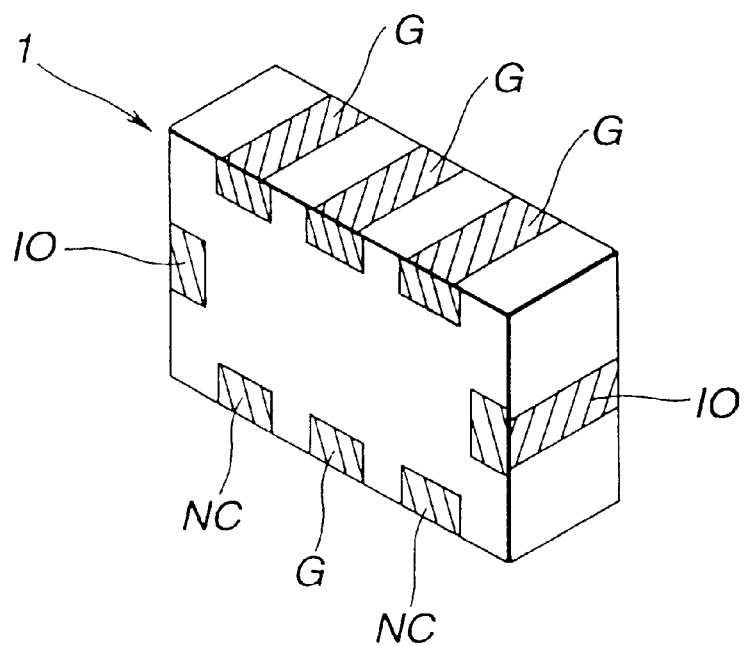
FIG. 3 is a perspective view of the resonator of FIG. 1 as viewed from the lower side thereof.

Referring first to FIGS. 1 to 4, a multilayer microelectronic circuit according to an embodiment of the present invention will be described. In this embodiment, the multilayer microelectronic circuit is constructed as a resonator which is generally indicated by 1. The resonator 1 comprises eight dielectric layers Z1 to Z8 each formed from a green sheet of a dielectric ceramic material. On the upper surfaces of the seven dielectric layers Z2 to Z8 other than the surface layer Z1 are respectively formed first to seventh electrodes P1 to P7 by printing an electrically conductive paste. The dielectric layers Z1 to Z8 are placed one upon another and baked or sintered so that the electrodes P1 to P7 are held between adjacent two of the dielectric layers Z1 to Z8, respectively. As shown in FIGS. 2 and 3, on the four peripheral side surfaces of the assembly of the laminated and sintered dielectric layers Z1 to Z8 are disposed a plurality of grounding lines G, a plurality of input/output lines IO and a plurality of circuit connecting lines NC which are formed from an electrically conductive paste which is printed on the peripheral side surfaces and sintered.

Figure 4:
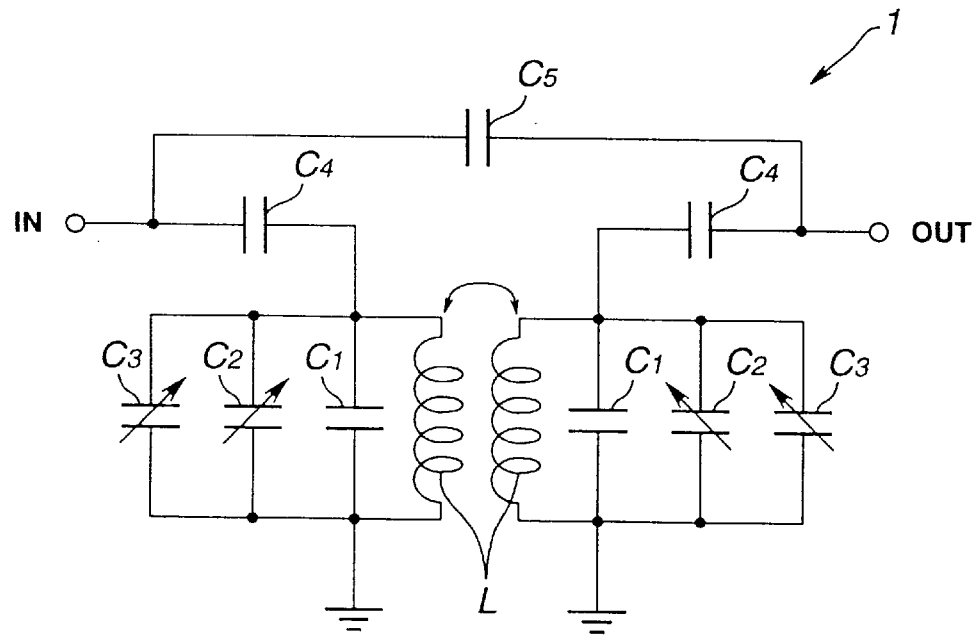
FIG. 4 is an equivalent circuit diagram of the resonator of FIG. 1.

In FIG. 4, an equivalent circuit of the resonator 1 is shown and consists of two resonant inductors L, two resonant capacitors C1, two rough adjustment capacitors C2, two fine adjustment capacitors C3, two input/output capacitors C4 and a polarizing capacitor C5 connecting between the input and output.

Each resonant capacitor C1 is constituted by the fourth dielectric layer Z4 and the third and fourth electrode patterns P3 and P4 on the upper and lower sides of the fourth dielectric layer Z4. The fourth dielectric layer Z4 and the third and fourth electrodes P3 and P4 on the upper and lower sides of the fourth dielectric layer Z4 correspond respectively to a main capacitor dielectric layer, a main capacitor first electrode and a main capacitor second electrode of a multilayer microelectronic circuit of the present invention.

Each rough adjustment capacitor C2 is constituted by the third dielectric layer Z3 and the second and third electrodes P2 and P3 on the upper and lower sides of the third dielectric layer Z3. The third dielectric layer Z3 and the second electrode P2 on the upper side thereof correspond to a first trimming capacitor dielectric layer and a first trimming capacitor electrode of the multilayer microelectronic circuit of the present invention, respectively.

Each fine adjustment capacitor C3 is constituted by the second dielectric layer Z2 and the first and second electrodes P1 and P2 on the upper and lower sides of the second dielectric layer Z2. The second dielectric layer Z2 and the first electrode P1 on the upper side thereof correspond to a second trimming capacitor dielectric layer and a second trimming capacitor electrode of the multilayer microelectronic circuit of the present invention, respectively.

Each input/output capacitor C4 is constituted by the fifth dielectric layer Z5 and the fourth and fifth electrodes P4 and P5 on the upper and lower sides of the fifth dielectric layer Z5. Further, the polarizing capacitor C5 is constituted by the sixth dielectric layer Z6 and the fifth and sixth electrodes P5 and P6. Further, each resonant inductor L is constituted by the seventh electrode P7 on the upper side of the eighth dielectric layer Z8.

Description will now be made as to the technique of changing or modifying the capacitance of the resonator 1.

Trimming is performed by a laser cutting device (not shown). First, the second electrode P2 (i.e., the first trimming capacitor electrode) which is a constituent part of the rough adjustment capacitor C2 is trimmed. The output of the laser cutting device is adjusted such that a laser beam produced by the laser cutting device can pass through the first and second dielectric layers Z1 and Z2 but not through the third dielectric layer Z3. The resonator 1 is irradiated with the thus adjusted laser beam on the first dielectric layer Z1 side to trim the second electrode P2 (i.e., the first trimming capacitor electrode) and thereby roughly adjust the capacitance of the resonator 1.

Then, the roughly adjusted capacitance is measured. Based on the thus measured capacitance, the trimming amount of the first electrode P1 (i.e., the second trimming capacitor electrode) is determined. Thereafter, the resonator 1 is radiated with such a laser beam that can pass through the first dielectric layer Z1 but not through the second dielectric layer Z2, on the first dielectric layer Z1 side to trim the first electrode P1 (i.e., the second trimming capacitor electrode) by a predetermined amount and thereby finely adjust the capacitance of the resonator 1.

In this embodiment, the capacitance of the resonator 1 is first subjected to rough adjustment by trimming the second electrode P2 (i.e., the first trimming capacitor electrode) and secondly to fine adjustment by trimming the first electrode pattern P1 (i.e., the second trimming capacitor electrode). Thus, a single resonator 1 can be modified into various resonators having variously varied resonant frequencies according to the present invention. As compared with the prior art resonator which requires to be designed and manufactured for every resonant frequency, the resonator 1 of this invention can be lower in cost.

In the foregoing structure, it is to be noted that the electrodes P1–P7 are enclosed or embedded in a dielectric ceramic mass and not exposed to the outside.

Figure 6:
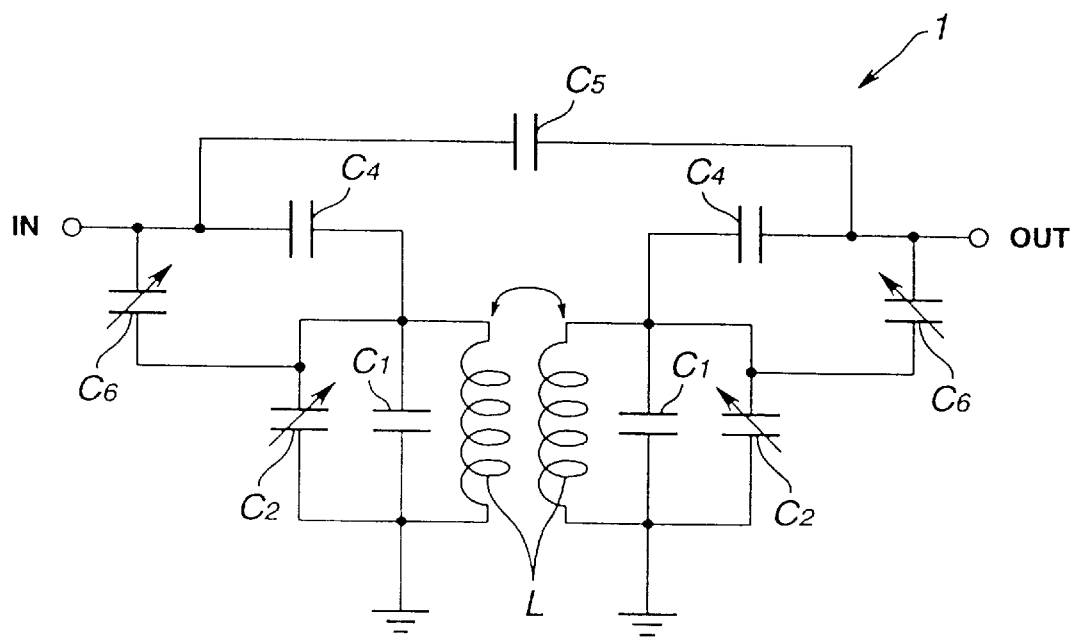
FIG. 6 is an equivalent circuit diagram of the resonator of FIG. 5.
Figure 5:
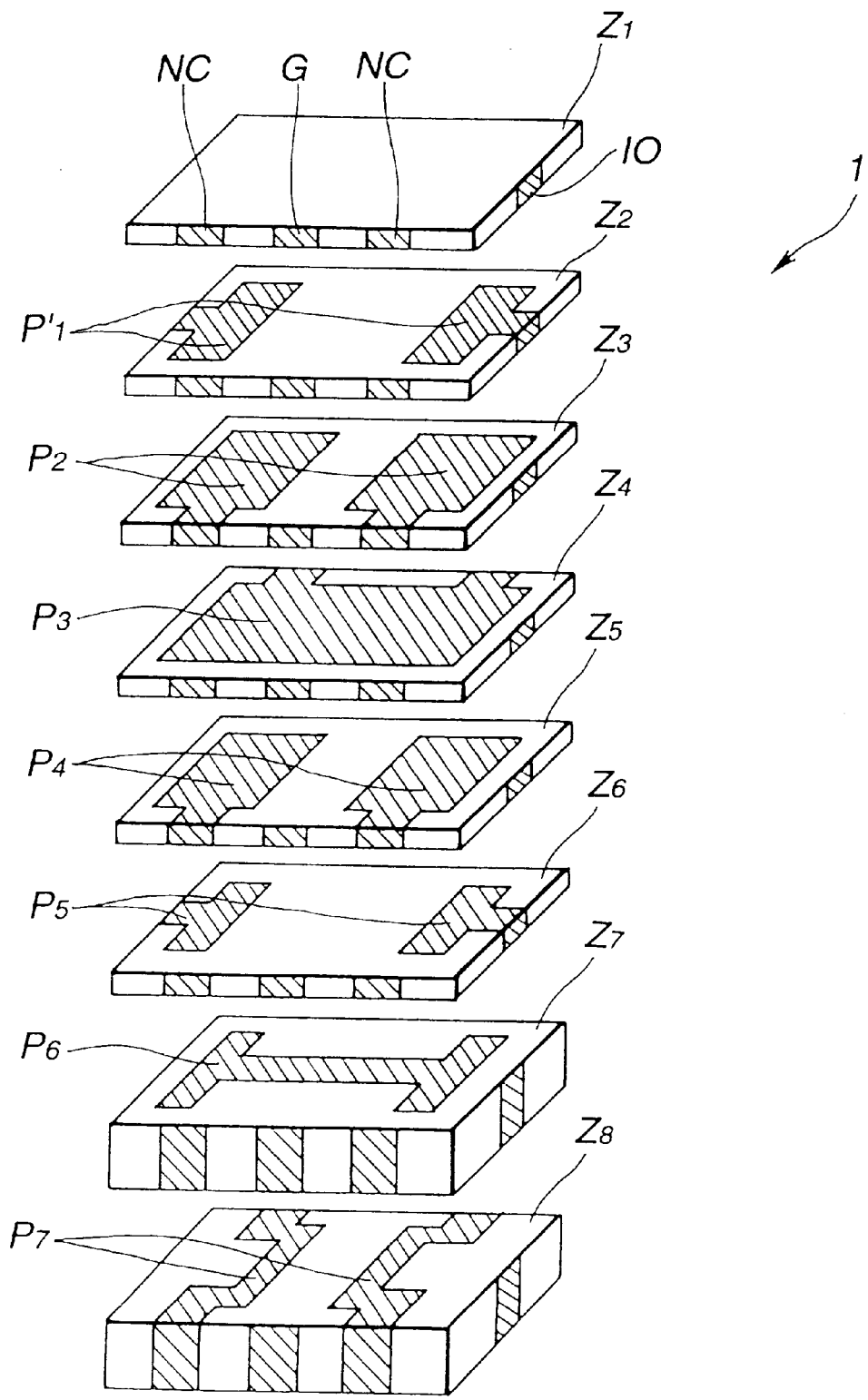
FIG. 5 is a view similar to FIG. 1 but shows another embodiment of the present invention.

Referring now to FIGS. 5 and 6, another embodiment of the present invention will be described.

Deferring from the embodiment of FIGS. 1 to 4 which is constructed so as to enable variations or modifications of the capacitance for setting the resonance frequency of the resonator 1, this embodiment is constructed so as to enable variations or modifications of a capacitance for setting a band width of an input/output filter.

Specifically, in the embodiment of FIGS. 1 to 4 the resonance capacitors C1 are provided with the fine adjustment capacitors C3, whereas in this embodiment the resonance capacitors C1 are provided with band width-adjusting capacitors C6 in parallel with the input/output capacitors C4, in place of the fine adjustment capacitors C3.

Each band width-adjusting capacitor C6 is constituted by the second dielectric layer Z2 and the first and second electrodes P1 and P2 on the upper and lower sides of the second dielectric layer Z2. The capacitance for determining the band width of the corresponding input/output filter is varied or modified by trimming the first electrode P1'.

By this embodiment of FIGS. 5 and 6, not only variations or modifications of the resonance frequency through rough adjustment by the capacitor C1 as described and shown in the embodiment of FIGS. 1 to 4 but also variations or modifications of the band width of the input/output filter can be attained. By comparison with a comparable prior art multilayer microelectronic circuit that requires design and manufacture of a new resonator every time when the band width is to be changed, a multilayer microelectronic circuit of the present invention can be lower in cost.

While the present invention has been described and shown as being applied to a resonator, it is not for the purpose of limitation but the present invention can be applied to another multilayer LC circuit. The present invention is further applicable to a multilayer hybrid integrated circuit having mounted thereon electric devices.

What is claimed is:

1. A multilayer microelectronic circuit which is adjustable in capacitance, comprising:
   a main capacitor dielectric layer;
   a main capacitor first electrode disposed on one of opposite sides of said main capacitor dielectric layer;
   a main capacitor second electrode disposed on the other of said opposite sides of said main capacitor dielectric layer in a way as to oppose said main capacitor first electrode through said main capacitor dielectric layer;
   a first trimming capacitor dielectric layer disposed on a side of said main capacitor first electrode opposite to said main capacitor dielectric layer;
   a first trimming capacitor electrode disposed on a side of said first trimming capacitor dielectric layer opposite to said main capacitor first electrode in a way as to oppose said main capacitor first electrode through said first trimming capacitor dielectric layer;
   a second trimming capacitor dielectric layer disposed on a side of said first trimming capacitor electrode opposite to said first trimming capacitor dielectric layer; and
   a second trimming capacitor electrode disposed on a side of said second trimming capacitor dielectric layer opposite to said first trimming capacitor electrode in a way as to oppose said first trimming capacitor electrode through said second trimming capacitor dielectric layer.

2. The multilayer microelectronic circuit according to claim 1, wherein one of said first trimming capacitor electrode and said second trimming capacitor electrode is larger in size and used for rough adjustment of a capacitance of the circuit and the other is smaller in size and used for fine adjustment of said capacitance.

3. The multilayer microelectronic circuit according to claim 1, wherein said first trimming capacitor electrode and said second trimming capacitor electrode constitute part of capacitors for setting a resonance frequency of a resonator.

4. The multilayer microelectronic circuit according to claim 1, wherein said first trimming capacitor electrode and said second trimming capacitor electrode constitute part of capacitors for setting a band width of an input/output filter.

5. A method of adjusting a capacitance of a multilayer microelectronic circuit, comprising the steps of:
   preparing a multilayer microelectronic circuit including a main capacitor dielectric layer, a main capacitor first electrode disposed on one of opposite sides of said main dielectric layer, a main capacitor second electrode disposed on the outer of said opposite sides of said main capacitor dielectric layer in a way as to oppose said main capacitor first electrode through said main capacitor dielectric layer, a first trimming capacitor dielectric layer disposed on a side of said main capacitor first electrode opposite to said main capacitor dielectric layer, a first trimming capacitor electrode disposed on a side of said first trimming capacitor dielectric layer opposite to said main capacitor first electrode in a way as to oppose said main capacitor first electrode through said first trimming capacitor dielectric layer, a second trimming capacitor dielectric layer disposed on a side of said first trimming capacitor electrode opposite to said first trimming capacitor dielectric layer, and a second trimming capacitor electrode disposed on a side of said second trimming capacitor dielectric layer opposite to said first trimming capacitor electrode in a way as to oppose said first trimming capacitor electrode through said second trimming capacitor dielectric layer;
   trimming one of said first trimming capacitor electrode and said second trimming capacitor electrode for rough adjustment of a capacitance of the circuit; and
   trimming the other of said first trimming capacitor electrode and said second trimming capacitor electrode for fine adjustment of said capacitance.

6. The method according to claim 5, wherein said trimming is performed by using a laser cutting device.

7. The method according to claim 6, wherein one of said first trimming capacitor electrode and said second trimming capacitor electrode is larger in size and subjected to said trimming for rough adjustment and the other is smaller in size and subjected to said trimming for fine adjustment.

8. A method of adjusting a capacitance of a multilayer microelectronic circuit, comprising the steps of:

preparing a multilayer microelectronic circuit including a main capacitor dielectric layer, a main capacitor first electrode disposed on one of opposite sides of said main dielectric layer, a main capacitor second electrode disposed on the other of said opposite sides of said main capacitor dielectric layer in a way as to oppose said main capacitor first electrode through said main capacitor dielectric layer, a first trimming capacitor dielectric layer disposed on a side of said main capacitor first electrode opposite to said main capacitor dielectric layer, a first trimming capacitor electrode disposed on a side of said first trimming capacitor dielectric layer opposite to said main capacitor first electrode in a way as to oppose said main capacitor first electrode through said first trimming capacitor dielectric layer, a second trimming capacitor dielectric layer disposed on a side of said first trimming capacitor electrode opposite to said first trimming capacitor dielectric layer, and a second trimming capacitor electrode disposed on a side of said second trimming capacitor dielectric layer opposite to said first trimming capacitor electrode in a way as to oppose said first trimming capacitor electrode through said second trimming capacitor dielectric layer;

trimming one of said first trimming capacitor electrode and said second trimming capacitor electrode for rough adjustment of a capacitance of the circuit; and trimming the other of said first trimming capacitor electrode and said second trimming capacitor electrode for fine adjustment of said capacitance.

9. The method according to claim 8, wherein said trimming is performed by using a laser cutting device.

10. The method according to claim 9, wherein one of said first trimming capacitor electrode and said second trimming capacitor electrode is larger in size and subjected to said trimming for rough adjustment and the other is smaller in size and subjected to said trimming for fine adjustment.

* * * * *